United States Patent [19]

Kirayoglu

[11] Patent Number: 4,735,587

[45] Date of Patent: Apr. 5, 1988

[54] PIN HEADER WITH BOARD RETENTION TAIL

[75] Inventor: Erol M. Kirayoglu, Spartanburg, S.C.

[73] Assignee: Specialty Electronics, Inc., Landrum, S.C.

[21] Appl. No.: 828,826

[22] Filed: Feb. 12, 1986

[51] Int. Cl.[4] .......................................... H01R 13/428
[52] U.S. Cl. ...................................... 439/751; 439/82
[58] Field of Search .......... 339/195 M, 196 M, 221 R, 339/221 M, 17 C, 252 R, 252 P; 439/82, 692–694, 751, 825–827, 873, 83, 84, 733, 741, 743, 746–749, 869–872

[56] References Cited

U.S. PATENT DOCUMENTS

| | | | |
|---|---|---|---|
| 2,214,024 | 9/1940 | Knapp | 339/221 R |
| 4,035,047 | 7/1977 | Ammon | 339/221 M |
| 4,050,769 | 9/1977 | Ammon | 339/196 M |
| 4,066,326 | 1/1978 | Lovendusky | 339/221 |
| 4,186,982 | 2/1980 | Cobaugh et al. | 339/17 |
| 4,487,463 | 12/1984 | Tillotson | 339/17 |
| 4,513,499 | 4/1985 | Roldan | 29/874 |
| 4,533,204 | 8/1985 | Moynagh et al. | 339/221 |
| 4,538,878 | 9/1985 | Dambach et al. | 339/217 |

FOREIGN PATENT DOCUMENTS 105044 4/1984 European Pat. Off. .
1490236 1/1964 Fed. Rep. of Germany .

OTHER PUBLICATIONS

Compliant Pin Concepts: An Analysis of Press-Fit Technology, AMP, Inc., May, 1981.

*Primary Examiner*—Gil Weidenfeld
*Assistant Examiner*—Gary F. Paumen

[57] ABSTRACT

A pin header with two rows of circuit board pins and with selected opposed pin pairs having formed cantilever retention arms for engaging the interior surfaces of circuit board holes to hold the pin header in place on a circuit board prior to and during wave soldering.

10 Claims, 1 Drawing Sheet

PIN HEADER WITH BOARD RETENTION TAIL

This invention relates to a specialized pin header and solder pin for forming a physical connection with a circuit board to assure that the pin header and pin are physically held in place on the board following mounting and subsequent wave soldering.

It is conventional to mount pin headers on circuit boards by freely extending uniform cross section 0.025 square pins projecting outwardly from the pin header body into plated holes extending through the board. The circuit board is then moved from the mounting station along a feed path to a wave solder station at which time molten solder and flux are flow against the lower surface of the board, into the circuit board hole and upon cooling, form electrical connections between the circuitry on the board and the pins extending from the header body.

In practice, movement of the circuit board prior to soldering and floating of the pin header during soldering tend to move or float the header from the desired location on the board with the result that when the solder cools the pin header may not be in proper location. Many expedients have been tried to prevent this problem including gluing or taping the pin header to the circuit board, bending one or more of the pins to physically engage the holes or even pre-soldering the pins in place on the circuit board. These expedients are expensive, time-consuming and unsatisfactory.

The invention eliminates the problem of accidental displacement of the pin header on a circuit board prior to and during soldering by providing integral sheared cantilever contact arms in the bodies of the pins fitted within the circuit board holes to bias the pins against the holes. The contact arms are sufficiently strong to hold the pin headers in place prior to and during wave soldering but are not sufficiently stiff to injure the delicate plating during mounting of the pin header on the circuit board.

The cantilever arms are preferably formed in selected opposed pairs of pins along the length of the pin header so that a sufficient number of arms are provided to hold the pin header on the board, dependent upon the length and properties of the pin header.

Other objects and features of the invention will become apparent as the description proceeds, especially when taken in conjunction with the accompanying drawings illustrating the invention, of which there is one sheets and two embodiments.

IN THE DRAWINGS

FIG. 1 is a side view of a pin header according to the invention;

FIGS. 2 and 3 are sectional views taken along lines 2—2 of FIG. 1 and 2—2 of FIG. 2 respectively;

Figure 2:
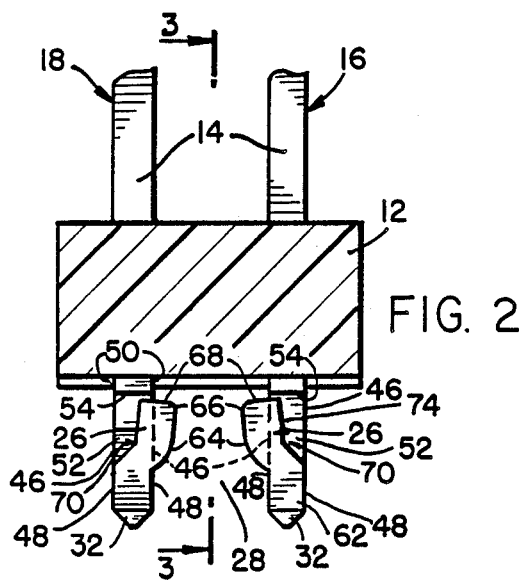

Pin header 10 includes an elongate molded plastic body 12 and two rows of square solder pins 14 extending to either side of the body. Pin rows 16 and 18 are illustrated in FIG. 2. The pins are formed from 0.025 inch square pinstock.

The body includes a lower circuit board contact surface 20 defined by a series of standoffs 22 extending across the width of the body between spaced pairs of pins 14. The standoffs 22 define recesses 24 adjacent the lower ends of pins 14 to limit wicking during wave soldering and allow cleaning.

One or more opposed pairs of pins 14 in rows 16 and 18 are provided with integral laced cantilever arms 26 for physically retaining the header 10 in proper location flush on the top of the circuit board prior to and during wave soldering. The arms 26 of each opposed pair of pins extend toward each other into the space 28 between the pin rows.

Figure 3:
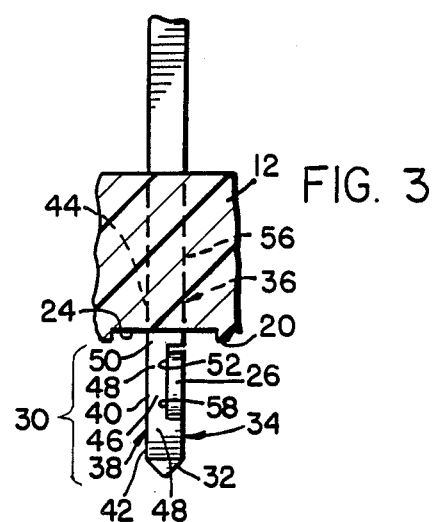

As shown in FIG. 3, each arm 26 is sheared from a straight section 30 of square cross section pin stock including the pin free end 32. Section 30 includes a first square cross section portion 34 adjacent the end of the pin, a second square cross section portion 36 spaced from portion 32 and an intermediate portion 38 joining portions 34 and 36. Part of portion 36 may be in the body 12. The arm 26 and middle portion 38 have approximately equal thicknesses, one-half the thickness of the pin stock of section 30 or, in the case of a 0.025 inch square pin as illustrated, about 0.0125 inch.

Arm 26 is sheared from the intermediate portion 38 of section 30 and bent to one side of the section as illustrated. The intermediate section includes an exterior major width side 40 away from the arm forming a continuation of the major width sides 42 and 44 of the adjacent first and second portions. The width of all major width sides is the width of the pin stock, in this case 0.025 inch. The intermediate portion also includes a pair of minor width exterior sides 46, only one of which is illustrated in FIG. 3, which form partial continuations of major width sides 48 and 50 of the first and second portions. The intermediate product also includes an interior major width shear surface 52 extending between sides 46 and running from the first portion to an interior step 54 extending from surface 52 to second portion major width exterior side 56. The surface 52 parallels side 40. Step 54 is perpendicular to surface 52 and to the longitudinal axis of the pin section 30.

The cantilever arm 26 includes an inner shear surface 58 coplanear with and overlapping shear surface 52. The arm also includes an exterior side 60 forming an extension of major width side 62 of the first portion. Side 60 is also coplanear with second portion side 56.

Figure 5:
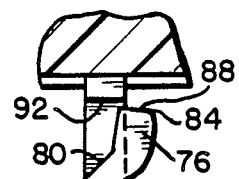
FIGS. 5 and 6 are views illustrating different circuit board solder pins in a pin header.
Figure 6:
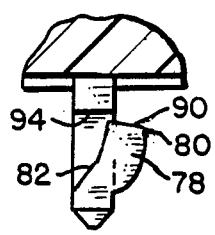

The arm also includes an exterior minor width side or contact surface 64 located outwardly of portion side 46. Side 64 has a smoothly rouned convex shape extending from first portion side 48 along the arm outwardly from the intermediate portion to a smoothly rounded corner 66 at the junction between the side and the arm free end 68. The arm free end is sheared away from the step 54 and, because of outwardly displacement of the arm, is canted at an angle to the step and faces outwardly from the pin axis. As illustrated in FIGS. 5 and 6, the greater the distance the arm is displaced from the intermediate portion, the greater the angle at which the free end face is canted from the step. The rounded corner 56 is a result of frictional engagement between the free end and the step during shearing of the arm. The upper end of surface 64 near the corner 66 extends at a shallow angle to the pin for non-destructive engagement with the plating in the circuit board hole.

The interior minor width side 70 of arm 26 extends across the shear surface 52 of the middle portion and includes a first flat face 72 extending at an angle of 45 degrees to the axis of the pin a distance from the first portion toward the step 54 and a second flat face 74 extending from the end of the first face to the arm free end 68. The second face is oriented at an angle of about 5 degrees to the axis of the pin. The faces 72 and 74 extend away from the plane of adjacent first portion sides 48.

The retention arm 26 may be formed in relatively short lengths of pins extending below the pin header body. As illustrated in FIGS. 2 and 3, the entire length of the pin below support surface 20 may be 0.10 inch with step 54 located 0.005 inch below surface 20. The intermediate portion has an axial length of 0.075 inch and the first portion has a short axial length of 0.020 inch. The first portion has sufficient strength to support the cantilever arm for proper engagement with circuit board hole and retention of the pin header on the board.

Pin headers 10 are manufactured using like uniform cross sections pins 14. Following mounting of the pins in the body 12 cantilever arms 26 are sheared from opposite pairs of pins as required along the length of the pin header. The shearing operation is performed by placing an anvil between the pair of pins in space 28 to support the first and intermediate portions against movement toward each other and then moving thin cutting tools against the outer surfaces of the pins to engage the outer sides of the pins and shear the arms from the pins. The leading edges of the tools are provided with flat 45 degree and 5 degree faces to first engage the end of the arm adjacent the step and then, with further inward movement, engage the length of the arm down to the first portion and shear the arm from the pin as described.

The displacement of the arms to one side of the pin section 30 is dependent upon the depth to which the tools are driven into the pins. For instance, FIG. 2 illustrates an 0.025 square pin with cantilever contact arms displaced sufficiently to increase the cross section dimension of the pin as shown in the Figure to 0.039 inch at the maximum displacement of the arm. This displacement is sufficient to assure that the pin tightly holds the pin header on a circuit board with holes having a diameter of 0.040 inch. FIGS. 5 and 6 illustrate similar solder pins with cantilever contact arms 76 and 78 displaced greater distances than arms 26. In FIG. 5, arm 76 is displaced to provide the pin with a cross section dimension of 0.042 inch for retention within a hole having a diameter of 0.043 inch. Finally, in FIG. 6, arm 78 is displaced to provide the pin with a dimension of 0.049 inch for holding the pin in a hole having a diameter of 0.48 inch.

The tools which shear the arms from the pins are provided with a relatively long 45 degree surfaces for forming the first flat face such that further displacement of the arm lengthens the first flat face, as indicated by the increasing length of first flat faces 80 and 82 of FIGS. 5 and 6. Arms 76 and 78 have rounded corners 84 and 86, like corners 66, and outwardly facing free ends 88 and 90, like free ends 68. During forming of the arms 26, 76 and 78 the outward displacement of the metal foreshortens the arms in an axial direction to provide clearance between the free ends and the adjacent steps. The clearance allows the arms to be deflected inwardly during insertion into a circuit board hole without binding against the steps which could result in damage to the plating.

Figure 4:
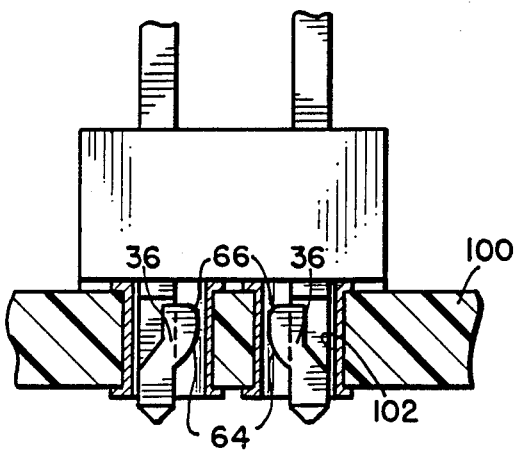
FIG. 4 is a sectional view showing the pin header mounted on a circuit board prior to wave soldering.

FIG. 4 illustrates the pin header 10 mounted on the upper surface of the circuit board with cantilever arms 26 mounted on circuit board 100 and the contact arms 26 in circuit holes 102. The arms are deflected inwardly during insertion into the holes to bias the arm contact sides 64 and the opposite side of the pin against the hole thereby physically retaining the pin header in place on the board. The smooth, continuous convex shape of sides 64 prevent the arms from injuring the delicate plating during insertion. Likewise, the rounded corners 66 protect the plating from injury.

The physical contact between the pins at the intermediate portions and the circuit board retains the pin header in place on the circuit board as illustrated during movement down a production line after mounting on the board and during wave soldering. Frequently the board is subjected to vibrations and other movements which may displace a freely mounted pin header as the board is moved from the pin header loading position toward wave soldering tank. During wave soldering, the molten high density solder and flux are flowed up against the bottom surface of the board and flows through the circuit board holes. Immersion of the circuit board may displace freely mounted pin headers so that following wave soldering and cooling of the solder the headers are secured in improper position on the board. The physical retention between the pins and the circuit board at the arms eliminates this problem.

Figure 1:
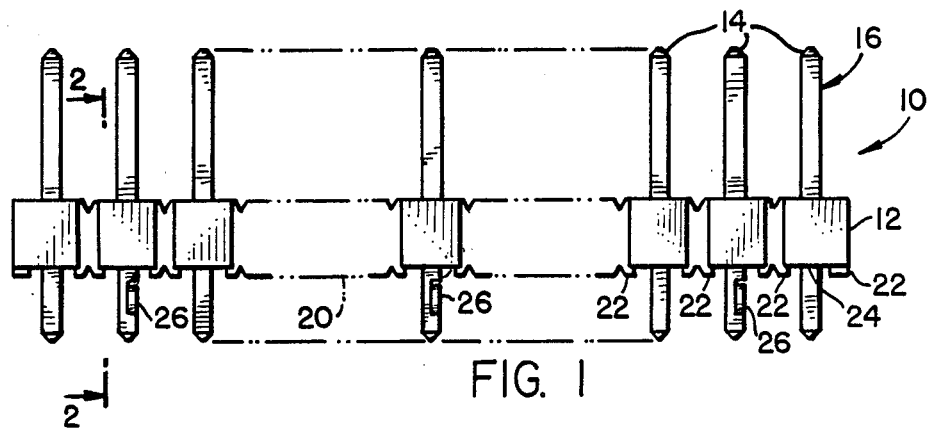

As illustrated in FIG. 1 cantilever arms 26 need to be provided at spaced locations along the given pin header. For instance, for a pin header having 25 to 36 pins in each row it is found sufficient to provide three pairs of retention arms to assure that the pin header is held in proper place on the circuit board.

Figure 7:
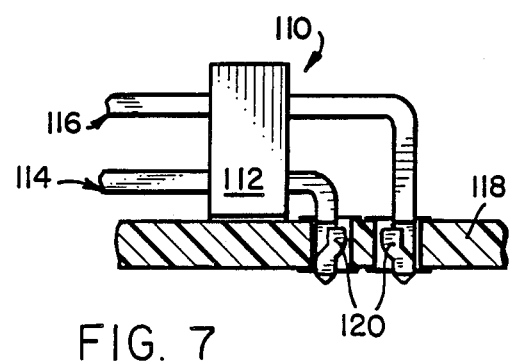
FIG. 7 is a sectional view illustrating a second embodiment pin header.

FIG. 7 illustrates a pin header 110 having a elongate plastic body 112 and two rows 114 and 116 of square cross section contact pins extending through the body. The pins extend outwardly of one side of the body and are then bent down 90 degrees to extend through plates circuit board holes in board 118. Selected opposite pairs of the L-shaped pins may be provided with cantilever retention arms 120, like arms 26, for folding the pin header 110 on board 118 prior to and during soldering.

Pin header 10 includes two rows of pins with retention arms 26 formed on opposed pairs of pins. The retention arms need not be foremd in directly opposed pins. For instance, in some applications the arms may be formed in pins which are longitudinally offset along the length of the body. The offset may be one or more pins. In the case of a relatively short pin header, arms need only be formed on one pin at the end of one row and another pin at the opposite end of the other row. The invention also contemplates pin headers like header 10 but with a single row of pins. Retention arms are formed in selected pins to retain a single row header on a circuit board.

While I have illustrated and described a preferred embodiment of my invention, it is understood that this is capable of modification, and I therefore do not wish to be limited to the precise details set forth, but desire to avail myself of such changes and alterations as fall within the purview of the following claims.

What I claim my invention is:

1. A circuit board pin including a straight section formed of uniform width square cross-section pin stock having:

(a) spaced apart first and second portions extending along a common longitudinal axis, each portion consisting of a length of flat sided square cross section pin stock;

(b) a connection joining the first and second portions, said connection consisting of a half stock width rectangular cross section middle portion located on one side of the straight section;
(c) a first shear surface on the interior of the middle portion and extending between the first and second portions;
(d) a step on the second portion at one end of the first shear surface; and
(e) a half stock width rectangular cross section cantilever arm on the other side of the straight section joined to the first portion at the other end of the first shear surface, the arm being bent laterally of the middle portion and having a free end adjacent to and below the step, the arm having a second shear surface generally coplanar with and overlying the first shear surface, an exterior full stock width side away from the shear surfaces and coplanar with adjacent sides of the first and second portions, an exterior half stock width side located outwardly of the middle portion and having a smoothly rounded convex circuit board hole contact surface extending from the first portion to the free end of the arm, and an interior half stock width side at least partially overlying the first shear surface and having a first face adjacent the first portion extending at approximately 45 degrees to the longitudinal axis of the sections and a second face extending from the first face to the free end of the arm at a shallow angle to the axis; whereby upon positioning of the first portion in a plated circuit board hole and movement of the pin into the hole the contact surface of the arm nondestructively engages plating in the hole, the arm is bent inwardly and resiliently holds the pin in the hole during soldering to form an electrical connection between the pin and the plating in the hole.

2. A circuit board pin as in claim 1 wherein the pin is straight and has the same square cross section along its length except at the middle portion.

3. A circuit board pin as in claim 1 wherein the longitudinal length of the first portion is less than the width of the pin.

4. A pin header including an elongate insulating body, a plurality of pins as in claim 1 mounted in the body in two spaced rows extending along the body with the arms located between the body and the first portions, the arms in each row of pins being bent toward the other row of pins.

5. A pin header as in claim 4 wherein the rows of pins include pairs of laterally opposed pins.

6. A pin header as in claim 4 wherein the body includes a circuit board contact surface and the pins extend outwardly of contact surface, the step is located a distance below the contact surface, the longitudinal length of the pin extending below the contact surface is X and the longitudinal length of the arm is approximately 75% X.

7. A pin header as in claim 6 wherein the pins are formed from 0.025 inch square pin stock, X is approximately 0.10 inch, the step is located approximately 0.005 inch below the contact surface, the longitudinal length of the first portion is approximately 0.020 inch and the maximum width of the pin at the middle portion and arm is between 0.039 and 0.049 inch for engagement with circuit board holes having a diameter of from about 0.040 inch to about 0.048 inch.

8. A pin header as in claim 7 wherein the shallow angle is approximately 5 degrees.

9. A circuit board pin as in claim 1 wherein the step is located a longitudinal distance X from the end of the first portion away from the middle portion and the longitudinal length of the arm is about 79%X.

10. A circuit board pin as in claim 9 wherein the pin is formed from 0.025 inch square pin stock, X is approximately 0.090 inch and the maximum width of the pin at the middle portion is between 0.039 inch and 0.049 inch for engagement with circuit board holes having a diameter of from 0.040 inch to about 0.048 inch.

* * * * *